United States Patent [19]

Voss

[11] 4,110,638

[45] Aug. 29, 1978

[54] CONFIGURATION FOR REDUCING THE TURN-OFF TIME OF A THYRISTOR

[75] Inventor: Peter Voss, Munich, Germany

[73] Assignee: Patent-Treuhand-Gesellschaft fur Elektrische Gluhlampen m.b.H., Munich, Germany

[21] Appl. No.: 771,278

[22] Filed: Feb. 23, 1977

[30] Foreign Application Priority Data

Feb. 25, 1976 [DE] Fed. Rep. of Germany ....... 2607678

[51] Int. Cl.² .................................. H03K 17/72
[52] U.S. Cl. .......................... 307/252 C; 307/252 A; 307/252 J; 307/305; 357/38; 357/68
[58] Field of Search ............ 307/252 A, 252 C, 252 J, 307/305; 357/38, 68

[56] References Cited

U.S. PATENT DOCUMENTS

| | | | |
|---|---|---|---|
| 3,590,346 | 6/1971 | Bilo et al. | 307/305 X |
| 3,821,565 | 6/1974 | Horinaga | 307/252 C |
| 3,896,476 | 7/1975 | Kawakami | 357/38 |

*Primary Examiner*—John Zazworsky
*Attorney, Agent, or Firm*—C. L. Menzemer

[57] ABSTRACT

The present invention is directed to a thyristor having a configuration for reducing turn-off time, said thyristor comprises a main thyristor portion having a main emitter electrode and a control electrode and an auxiliary thyristor portion having an auxiliary emitter electrode and adapted for amplifying the control current, the arrangement includes a voltage source connected to the auxiliary thyristor, and supplying the auxiliary emitter electrode with a current the direction of which is opposite to the direction of the control current.

4 Claims, 5 Drawing Figures

CONFIGURATION FOR REDUCING THE TURN-OFF TIME OF A THYRISTOR

BACKGROUND OF THE INVENTION

1. Field of the Invention

This invention is in the field of discrete semiconductor devices and is particularly directed to discrete thyristors.

2. Description of the Prior Art

The "turn-off time" of a thyristor is the time between the zero passage of a load current and the moment when the thyristor has regained its blocking capability.

It is known that the turn-off time of a thyristor can be decreased considerably by provision of recombination centers. However, excessive doping to provide the recombination centers results in considerable increase in power dissipation in the forward direction.

It is also known that the turn-off time of a thyristor can be reduced by supplying the control electrode with a current opposite in direction to the control current, thereby upon recovery of the positive potential, causing part of the charge carriers stored in the semiconductor body to be drawn off and thus made unavailable for effecting an undesirable firing.

However, the known techniques for reducing turn-off time of a thyristor require a considerable number of electronic components because both control impluses of one polarity and impulses of the opposite polarity must be produced by means of one and the same impulse source.

SUMMARY OF THE INVENTION

The present invention comprises a thyristor having a reduced turn-off time comprising a main thyristor having a main emitter electrode and a control electrode and an auxiliary thyristor, said auxiliary thyristor being adapted to amplify a control current, said auxiliary thyristor having an auxiliary emitter electrode, a voltage source electrically connected to the auxiliary thyristor to supply through said auxiliary emitter of said auxiliary thyristor a current opposite in direction to the control current.

DESCRIPTION OF PREFERRED EMBODIMENTS

The known method for reducing the turn-off time of a thyristor consists in principle of a voltage source which can provide impulses of both polarities.

Figure 1:
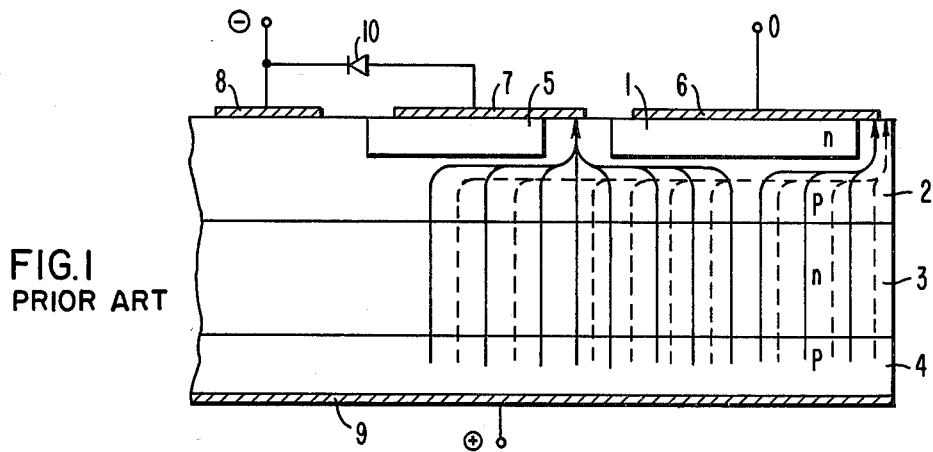
FIG. 1 is a schematic diagram of a prior art thyristor having a reduced turn-off time.

With reference to FIG. 1 which shows a thyristor for the sake of clarity the power source is not shown. The power source is connected, through an electrode 8, to p-base zone 2 of a thyristor body consisting of zones 1, 2, 3, and 4, and, on the other hand, is connected to auxiliary emitter 5 through a diode 10 and an auxiliary emitter electrode 7. The n-emitter 1 and the p-emitter 4 are provided with an emitter electrode 6 and with an electrode 9, respectively.

For the purpose of explaining the operation, let it be assumed that charge carriers are stored in the semiconductor body from the previous conductive mode and that a steeply rising positive potential is applied to the thyristor. For example, let the emitter electrode 6 be at zero potential, and the electrode 9 at a positive potential with respect to emitter 1. Under these conditions, a part of the charge carriers stored in the semiconductor body will flow to the emitter electrode 6 in a direction parallel to the pn-junction between emitter 1 and base 2. This current is indicated by the broken-line arrows. If, at any point along the pn-junction, the firing potential of about 0.5 V is reached, the main thyristor comprising the zones 1, 2, 3, 4, can fire even without a control impulse applied to control electrode 8. This means that the turn-off time of the thyristor is too low for the operating frequency for which it is used. If a negative impulse is applied to the auxiliary emitter electrode 7 through the diode 10, a large portion of the charge carriers stored in the semiconductor body will flow to the auxiliary emitter electrode 7, and only a correspondingly smaller portion will fow under the pn-junction between zones 1 and 2 to the main emitter electrode 6. This current flow pattern is illustrated by the solid lines. At the moment when the negative impulse on the auxiliary emitter electrode 7 is strong enough, the current provided by the stored charge carriers flowing to the main emitter electrode 6 will not, in this case be sufficient to fire the thyristor.

Figure 2:
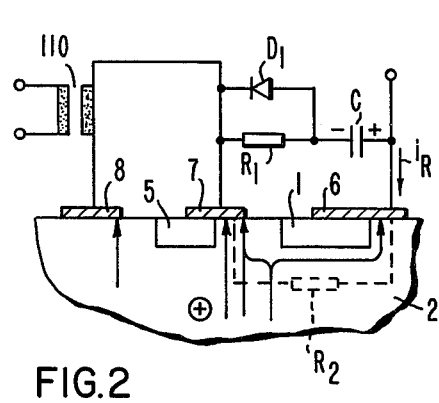
FIGS. 2 to 5 are schematic diagrams of portions of thyristors having turn-off time reduced in accordance with the teachings of this invention.

A first embodiment of the invention is illustrated in FIG. 2, in which for the sake of clarity, the larger portion of the semiconductor body is not shown. Components of the thyristor which correspond to components shown in FIG. 1 are provided with the same reference symbols as are corresponding components in FIGS. 3 to 5. The current source for reducing the turn-off time is connected between the main emitter electrode 6 and the auxiliary emitter electrode 7. It consists of a condenser C, and a resistance $R_1$ having a diode $D_1$ connected in parallel therewith. The polarity of the diode $D_1$ is such that the condenser is charged by a reverse current which flows in the blocking direction upon commutation of the thyristor. The diode $D_1$ should have a low forward voltage drop. It may be a Schottky diode for example. The resistance $R_1$ is selected to be smaller than the resistance between the auxiliary emitter electrode 7 and the emitter electrode 6 in zone 2 of the semiconductor body, which last mentioned resistance is indicated in broken lines at $R_2$ within the semiconductor body.

The circuit must fulfill several conditions:

1. The resistance $R_1$ must have a value to ensure that there will not be too much current flow into the discharged condenser C when the auxiliary thyristor is turned on.

2. The discharge time constant $(R_1 + R_2) C$ must be large enough to ensure that there will still be a potential on the condenser at the end of the turn-off time. On the other hand, the arrangement is more effective, with regard to reducing the turn-off time, the smaller the resistance $R_1$. The resistance $R_2$ is determined by the component and may be 2 Ohms for example. Resistance $R_1$ should be smaller than $R_2$ and may have a value of 0.5 Ohm, for example. With a charge $Q$ flowing upon commutation into the condenser, the potential on the condenser is $U_o = Q/C$. Towards the end of the turn-off time, the residual voltage should be as high as possible. This is attained if, for a turn-off time $t_q$, the resistance $R_1$ and the capacitance $C$ are selected such that $(R_1 + R_2)C = t_q$. If the thyristor has a turn-off time of $10\mu s$, the condenser should have a value of $4\mu F$ in this example.

With a load applied in the blocking direction, the current indicated by solid line arrows will flow from the semiconductor body for the most part through the auxiliary emitter electrode 7 and the diode $D_1$. The condenser C is charged by the reverse current $i_R$ to have the polarity indicated. A small part of the current will flow also to the emitter electrode 6.

In the embodiment of FIG. 2, the control circuit is not connected between the control electrode and the main emitter electrode, but is connected between the control electrode and the auxiliary emitter electrode is interconnected through the secondary winding of a transformer 110. This is necessary to prevent the condenser C from discharging through the control circuit. In general the auxiliary thyristor requires no negative bias voltage because in most cases it remains turned on for a considerably shorter period than the main thyristor so that the stored carriers have more time for recombination.

Figure 3:
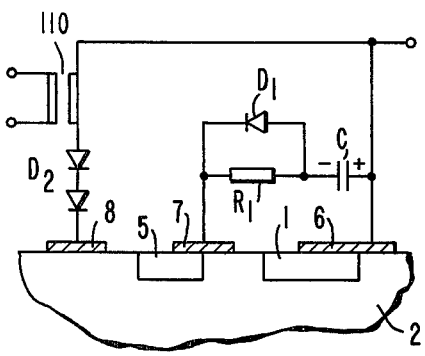

A modification of the embodiment of FIG. 2 is illustrated in FIG. 3. The two arrangements differ from each other essentially only in that the control circuit in FIG. 3 is connected to the main emitter electrode. A discharge of the condenser C through the control circuit is prevented in this case by means of the diodes $D_2$ which will pass the positive control pulse. The number of diodes $D_2$ must be such that the sum of the threshold potentials (about 0.5 V per diode) exceeds the maximum potential on the condenser C.

Figure 4:
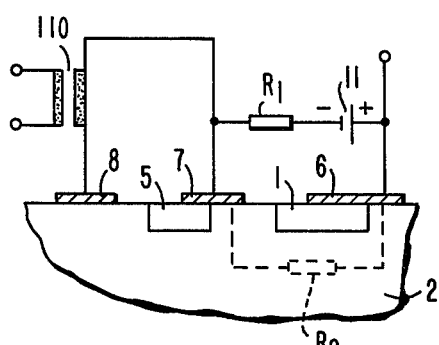

FIG. 4 shows an arrangement in which the current source between the auxiliary emitter electrode and the main emitter electrode is formed by a battery 11 and a resistance $R_1$ connected electrically in series relationship. In this embodiment the auxiliary thyristor is constantly biased, the bias being a function of the power loss which may occur in the main thyristor, as indicated by the resistance $R_2$. The maximum voltage of the battery 11 is determined by the blocking potential of the pn-junction between the emitter 1 and the base 2, which lies at about 20 V in the usual silicon thyristors. The effectiveness of the device is the greater the smaller the sum of the resistance $R_1$ and the cross resistance $R_2$ under the n-emitter 1. For example, the battery may have a voltage of $-5$ V, and the value of the resistance $R_1$ may be 0.5 Ohm.

Figure 5:
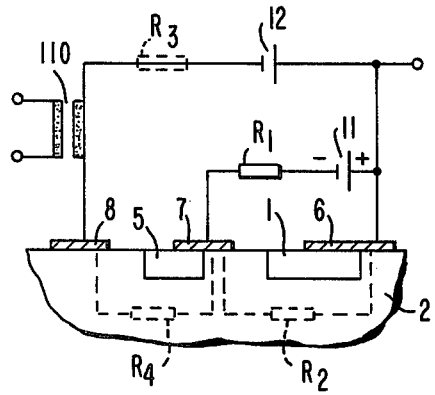

FIG. 5 shows an arrangement in which the auxiliary thyristor is also provided with a constant negative bias. In addition to the battery 11, a further source of constant potential comprising a battery 12 is connected between the main emitter electrode 6 and the control electrode 8. In this case, the voltage of battery 12 must be higher than that of battery 11, a potential difference of 0.5 V being sufficient. In this case, for example, battery 11 may provide $-5$ V, and the battery 12 may provide $-5.5$ V. In general the resistance $R_4$ in the semiconductor body between the electrodes 6 and 8 is considerably higher than $R_2$. Therefore, it will be possible in most cases to omit the current limiting resistance $R_3$.

With the arrangements of FIGS. 2 and 3, in the given parameters the turn-off time is reduced about 20%. The other circuit configurations, with the given voltages and sizes, will reduce the turn-off time over 30%. This will suffice in many cases in which the use of such electronically complex arrangements as heretofore employed for this purpose of reducing turn-off time would not be deemed justified.

The circuit configurations in accordance with the invention preferably will be used wherever the simplicity of the circuit is considered more important than the maximum possible decrease of turn-off time.

We claim as our invention:

1. An arrangement for reducing turn-off time of a thyristor having a main emitter electrode affixed to a main emitter region, a control electrode affixed to a base region, and including an auxiliary thyristor which is adapted to amplify a control current and has an auxiliary emitter electrode affixed to an emitter region of the auxiliary thyristor, said arrangement including a voltage source electrically connected to the auxiliary thyristor and adapted to supply to said auxiliary emitter an electrical current opposite in direction to the control current supplied to the thyristor, said voltage source being interposed between the main emitter electrode and the auxiliary emitter electrode and being connected electrically in series with an electrical resistance.

2. The arrangement of claim 1 in which the voltage source comprises a condenser and a resistance connected electrically in series, said resistance having a diode connected electrically in parallel therewith, the diode being so poled that the condenser is charged by an electric current flowing through the thyristor upon commutation in a blocking direction.

3. The arrangement of claim 2 in which the control electrode and the emitter of the auxiliary thyristor are electrically connected through a secondary winding of a transformer.

4. The arrangement of claim 2 in which the main emitter is electrically connected to the control electrode through at least one additional diode, said additional diode being poled in the forward direction with respect to a discharge current of the condenser.

* * * * *